US008133554B2

(12) United States Patent
Dando et al.

(10) Patent No.: US 8,133,554 B2
(45) Date of Patent: Mar. 13, 2012

(54) METHODS FOR DEPOSITING MATERIAL ONTO MICROFEATURE WORKPIECES IN REACTION CHAMBERS AND SYSTEMS FOR DEPOSITING MATERIALS ONTO MICROFEATURE WORKPIECES

(75) Inventors: Ross S. Dando, Nampa, ID (US); Dan Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 1103 days.

(21) Appl. No.: 10/840,571

(22) Filed: May 6, 2004

(65) Prior Publication Data

US 2005/0249887 A1   Nov. 10, 2005

(51) Int. Cl.
C23C 16/02 (2006.01)
C23C 16/04 (2006.01)
C23C 16/42 (2006.01)
C23C 16/48 (2006.01)
C23C 16/52 (2006.01)
C23C 16/56 (2006.01)
B05D 3/06 (2006.01)

(52) U.S. Cl. ... 427/555; 427/557; 427/586; 427/255.26; 216/65; 216/94

(58) Field of Classification Search ............... None
See application file for complete search history.

(56) References Cited

U.S. PATENT DOCUMENTS

| 127,031 A | 5/1872 | Dayton |
| 131,943 A | 10/1872 | Dayton |
| 579,269 A | 3/1897 | Hent |
| 1,741,519 A | 12/1926 | Huff |
| 2,508,500 A | 5/1950 | de Lange |
| RE24,291 E | 3/1957 | Goodyer |
| 3,522,836 A | 8/1970 | King |
| 3,618,919 A | 11/1971 | Beck |
| 3,620,934 A | 11/1971 | Endle |
| 3,630,769 A | 12/1971 | Hart et al. |
| 3,630,881 A | 12/1971 | Lester et al. |
| 3,634,212 A | 1/1972 | Valayll et al. |

(Continued)

FOREIGN PATENT DOCUMENTS

DE   4003882 A1 *   8/1991

(Continued)

OTHER PUBLICATIONS

"Selective Deposition with 'Dry' Vaporizable Lift-Off Mask", IBM Technical Disclosure Bulletin, vol. #35, issue #1A, pp. 75-76, Jun. 1, 1992.*

(Continued)

*Primary Examiner* — Marianne L Padgett
(74) *Attorney, Agent, or Firm* — Perkins Coie LLP

(57) ABSTRACT

Methods for depositing material onto microfeature workpieces in reaction chambers and systems for depositing materials onto microfeature workpieces are disclosed herein. In one embodiment, a method includes depositing molecules of a gas onto a microfeature workpiece in the reaction chamber and selectively irradiating a first portion of the molecules on the microfeature workpiece in the reaction chamber with a selected radiation without irradiating a second portion of the molecules on the workpiece with the selected radiation. The first portion of the molecules can be irradiated to activate the portion of the molecules or desorb the portion of the molecules from the workpiece. The first portion of the molecules can be selectively irradiated by impinging the first portion of the molecules with a laser beam or other energy source.

17 Claims, 9 Drawing Sheets

U.S. PATENT DOCUMENTS

| | | |
|---|---|---|
| 3,744,771 A | 7/1973 | Deaton |
| 3,945,804 A | 3/1976 | Shang et al. |
| 4,018,949 A | 4/1977 | Donakowski et al. |
| 4,022,928 A * | 5/1977 | Piwcyzk ................ 430/296 |
| 4,098,923 A | 7/1978 | Alberti et al. |
| 4,242,182 A | 12/1980 | Popescu |
| 4,242,370 A | 12/1980 | Abdalla et al. |
| 4,269,625 A | 5/1981 | Molenaar |
| 4,289,061 A | 9/1981 | Emmett |
| 4,313,783 A | 2/1982 | Davies et al. |
| 4,388,342 A | 6/1983 | Suzuki et al. |
| 4,397,753 A | 8/1983 | Czaja |
| 4,436,674 A | 3/1984 | McMenamin |
| 4,438,724 A | 3/1984 | Doehler et al. |
| 4,469,801 A | 9/1984 | Hirai et al. |
| 4,492,716 A | 1/1985 | Yamazaki et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,595,399 A | 6/1986 | Collins et al. |
| 4,615,904 A * | 10/1986 | Ehrlich et al. ............ 427/552 |
| 4,681,777 A | 7/1987 | Engelken et al. |
| 4,721,629 A * | 1/1988 | Sakai et al. ................ 438/80 |
| 4,738,295 A | 4/1988 | Genser et al. |
| 4,780,178 A | 10/1988 | Yoshida et al. |
| 4,821,302 A * | 4/1989 | Whitlock et al. ............ 378/73 |
| 4,826,579 A | 5/1989 | Westfall |
| 4,832,115 A | 5/1989 | Albers et al. |
| 4,871,417 A | 10/1989 | Nishizawa et al. |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,962,057 A * | 10/1990 | Epler et al. .................. 148/33 |
| 4,966,646 A | 10/1990 | Zdeblick |
| 4,977,106 A | 12/1990 | Smith |
| 4,988,879 A * | 1/1991 | Zare et al. ............ 250/423 P |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,065,697 A * | 11/1991 | Yoshida et al. ............ 118/719 |
| 5,076,205 A | 12/1991 | Vowles et al. |
| 5,090,985 A | 2/1992 | Soubeyrand |
| 5,091,207 A | 2/1992 | Tanaka |
| 5,131,752 A | 7/1992 | Yu et al. |
| 5,136,975 A | 8/1992 | Bartholomew et al. |
| 5,139,606 A * | 8/1992 | Maki ........................ 438/504 |
| 5,172,849 A | 12/1992 | Barten et al. |
| 5,178,683 A | 1/1993 | Takamura et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell et al. |
| 5,364,219 A | 11/1994 | Takahashi et al. |
| 5,366,557 A | 11/1994 | Yu |
| 5,372,837 A | 12/1994 | Shimoyama et al. |
| 5,377,429 A | 1/1995 | Sandhu et al. |
| 5,378,502 A * | 1/1995 | Willard et al. ............ 427/305 |
| 5,380,396 A | 1/1995 | Shikida et al. |
| 5,409,129 A | 4/1995 | Tsukada et al. |
| 5,418,180 A | 5/1995 | Brown |
| 5,421,957 A | 6/1995 | Carlson et al. |
| 5,427,666 A | 6/1995 | Mueller et al. |
| 5,432,015 A | 7/1995 | Wu et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,474,612 A | 12/1995 | Sato et al. |
| 5,477,623 A | 12/1995 | Tomizawa et al. |
| 5,480,818 A | 1/1996 | Matsumoto et al. |
| 5,496,410 A | 3/1996 | Fukuda et al. |
| 5,498,292 A | 3/1996 | Ozaki |
| 5,500,256 A | 3/1996 | Watabe |
| 5,505,986 A | 4/1996 | Velthaus et al. |
| 5,514,501 A * | 5/1996 | Tarlov ................ 430/5 |
| 5,522,934 A | 6/1996 | Suzuki et al. |
| 5,527,396 A | 6/1996 | Saitoh et al. |
| 5,532,190 A | 7/1996 | Goodyear et al. |
| 5,536,317 A | 7/1996 | Crain et al. |
| 5,558,717 A | 9/1996 | Zhao et al. |
| 5,562,800 A | 10/1996 | Kawamura |
| 5,569,350 A | 10/1996 | Osada et al. |
| 5,575,883 A | 11/1996 | Nishikawa et al. |
| 5,589,002 A | 12/1996 | Su |
| 5,589,110 A | 12/1996 | Motoda et al. |
| 5,592,581 A | 1/1997 | Okase |
| 5,595,606 A | 1/1997 | Fujikawa et al. |
| 5,599,513 A | 2/1997 | Masaki et al. |
| 5,609,798 A | 3/1997 | Liu et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,658,503 A | 8/1997 | Johnston et al. |
| 5,683,538 A | 11/1997 | O'Neill et al. |
| 5,693,288 A | 12/1997 | Nakamura |
| 5,716,796 A | 2/1998 | Bull et al. |
| 5,729,896 A | 3/1998 | Dalal et al. |
| 5,733,375 A | 3/1998 | Fukuda et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino |
| 5,772,771 A | 6/1998 | Li et al. |
| 5,773,085 A | 6/1998 | Inoue et al. |
| 5,788,778 A | 8/1998 | Shang et al. |
| 5,792,269 A | 8/1998 | Deacon et al. |
| 5,792,700 A | 8/1998 | Turner et al. |
| 5,803,938 A | 9/1998 | Yamaguchi et al. |
| 5,819,683 A | 10/1998 | Ikeda et al. |
| 5,820,641 A | 10/1998 | Gu et al. |
| 5,820,686 A | 10/1998 | Moore |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,865,887 A | 2/1999 | Wijaranakula et al. |
| 5,866,986 A | 2/1999 | Pennington |
| 5,868,159 A | 2/1999 | Loan et al. |
| 5,879,459 A | 3/1999 | Gadgil et al. |
| 5,879,516 A | 3/1999 | Kasman |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |
| 5,936,829 A | 8/1999 | Moslehi |
| 5,940,684 A | 8/1999 | Shakuda et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,963,336 A | 10/1999 | McAndrew et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,016,611 A | 1/2000 | White et al. |
| 6,022,483 A | 2/2000 | Aral |
| 6,025,110 A * | 2/2000 | Nowak ................ 430/200 |
| 6,032,923 A | 3/2000 | Biegelsen et al. |
| 6,039,557 A | 3/2000 | Unger et al. |

| | | | |
|---|---|---|---|
| 6,042,652 A | 3/2000 | Hyun et al. | |
| 6,045,620 A | 4/2000 | Tepman et al. | |
| 6,059,885 A | 5/2000 | Ohashi et al. | |
| 6,062,256 A | 5/2000 | Miller et al. | |
| 6,070,551 A | 6/2000 | Li et al. | |
| 6,079,426 A | 6/2000 | Subrahmanyam et al. | |
| 6,080,446 A | 6/2000 | Tobe et al. | |
| 6,086,677 A | 7/2000 | Umotoy et al. | |
| 6,089,543 A | 7/2000 | Freerks | |
| 6,090,210 A | 7/2000 | Ballance et al. | |
| 6,109,206 A | 8/2000 | Maydan et al. | |
| 6,113,698 A | 9/2000 | Raaijmakers et al. | |
| 6,123,107 A | 9/2000 | Selser et al. | |
| 6,129,331 A | 10/2000 | Henning et al. | |
| 6,139,700 A | 10/2000 | Kang et al. | |
| 6,142,163 A | 11/2000 | McMillin et al. | |
| 6,143,077 A | 11/2000 | Ikeda et al. | |
| 6,143,078 A | 11/2000 | Ishikawa et al. | |
| 6,143,659 A | 11/2000 | Leem | |
| 6,144,060 A | 11/2000 | Park et al. | |
| 6,149,123 A | 11/2000 | Harris et al. | |
| 6,156,393 A * | 12/2000 | Polanyi et al. | 427/533 |
| 6,159,297 A | 12/2000 | Herchen et al. | |
| 6,159,298 A | 12/2000 | Saito et al. | |
| 6,160,243 A | 12/2000 | Cozad | |
| 6,161,500 A | 12/2000 | Kopacz et al. | |
| 6,173,673 B1 | 1/2001 | Golovato et al. | |
| 6,174,366 B1 | 1/2001 | Ihantola | |
| 6,174,377 B1 | 1/2001 | Doering et al. | |
| 6,174,809 B1 | 1/2001 | Kang et al. | |
| 6,178,660 B1 | 1/2001 | Emmi et al. | |
| 6,179,923 B1 | 1/2001 | Yamamoto et al. | |
| 6,182,603 B1 | 2/2001 | Shang et al. | |
| 6,183,563 B1 | 2/2001 | Choi et al. | |
| 6,190,459 B1 | 2/2001 | Takeshita et al. | |
| 6,192,827 B1 | 2/2001 | Welch et al. | |
| 6,193,802 B1 | 2/2001 | Pang et al. | |
| 6,194,628 B1 | 2/2001 | Pang et al. | |
| 6,197,119 B1 | 3/2001 | Dozoretz et al. | |
| 6,199,465 B1 | 3/2001 | Hattori et al. | |
| 6,200,415 B1 | 3/2001 | Maraschin | |
| 6,203,613 B1 | 3/2001 | Gates et al. | |
| 6,206,967 B1 | 3/2001 | Mak et al. | |
| 6,206,972 B1 | 3/2001 | Dunham | |
| 6,207,937 B1 | 3/2001 | Stoddard et al. | |
| 6,210,754 B1 | 4/2001 | Lu et al. | |
| 6,211,033 B1 | 4/2001 | Sandhu et al. | |
| 6,211,078 B1 | 4/2001 | Mathews | |
| 6,214,714 B1 | 4/2001 | Wang et al. | |
| 6,217,704 B1 | 4/2001 | Kitagawa et al. | |
| 6,237,394 B1 | 5/2001 | Harris et al. | |
| 6,237,529 B1 | 5/2001 | Spahn | |
| 6,245,192 B1 | 6/2001 | Dhindsa et al. | |
| 6,251,190 B1 | 6/2001 | Mak et al. | |
| 6,255,222 B1 | 7/2001 | Xia et al. | |
| 6,263,829 B1 | 7/2001 | Schneider et al. | |
| 6,264,788 B1 | 7/2001 | Tomoyasu et al. | |
| 6,270,572 B1 | 8/2001 | Kim et al. | |
| 6,273,954 B2 | 8/2001 | Nishikawa et al. | |
| 6,277,763 B1 | 8/2001 | Kugimiya et al. | |
| 6,280,584 B1 | 8/2001 | Kumar et al. | |
| 6,287,965 B1 | 9/2001 | Kang et al. | |
| 6,287,980 B1 | 9/2001 | Hanazaki et al. | |
| 6,290,491 B1 | 9/2001 | Shahvandi et al. | |
| 6,291,337 B1 | 9/2001 | Sidhwa | |
| 6,294,394 B1 | 9/2001 | Erickson et al. | |
| 6,297,539 B1 | 10/2001 | Ma et al. | |
| 6,302,964 B1 | 10/2001 | Umotoy et al. | |
| 6,302,965 B1 | 10/2001 | Umotoy et al. | |
| 6,303,953 B1 | 10/2001 | Doan et al. | |
| 6,305,314 B1 | 10/2001 | Sneh et al. | |
| 6,309,161 B1 | 10/2001 | Hofmeister | |
| 6,315,859 B1 | 11/2001 | Donohoe | |
| 6,328,803 B2 | 12/2001 | Rolfson et al. | |
| 6,329,297 B1 | 12/2001 | Balish et al. | |
| 6,333,272 B1 | 12/2001 | McMillin et al. | |
| 6,334,928 B1 | 1/2002 | Sekine et al. | |
| 6,342,277 B1 | 1/2002 | Sherman | |
| 6,346,477 B1 | 2/2002 | Kaloyeros et al. | |
| 6,347,602 B2 | 2/2002 | Goto et al. | |
| 6,347,918 B1 | 2/2002 | Blahnik | |
| 6,355,561 B1 | 3/2002 | Sandhu et al. | |
| 6,358,323 B1 | 3/2002 | Schmitt et al. | |
| 6,364,219 B1 | 4/2002 | Zimmerman et al. | |
| 6,374,831 B1 | 4/2002 | Chandran et al. | |
| 6,375,744 B1 | 4/2002 | Murugesh et al. | |
| 6,383,300 B1 | 5/2002 | Saito et al. | |
| 6,387,185 B2 | 5/2002 | Doering et al. | |
| 6,387,207 B1 | 5/2002 | Janakiraman et al. | |
| 6,387,324 B1 | 5/2002 | Patterson et al. | |
| 6,402,806 B1 | 6/2002 | Schmitt et al. | |
| 6,402,849 B2 | 6/2002 | Kwag et al. | |
| 6,415,736 B1 | 7/2002 | Hao et al. | |
| 6,419,462 B1 | 7/2002 | Horie et al. | |
| 6,420,230 B1 | 7/2002 | Derderian et al. | |
| 6,420,742 B1 | 7/2002 | Ahn et al. | |
| 6,425,168 B1 | 7/2002 | Takaku et al. | |
| 6,428,859 B1 | 8/2002 | Chiang et al. | |
| 6,432,256 B1 | 8/2002 | Raoux | |
| 6,432,259 B1 | 8/2002 | Noorbaksh et al. | |
| 6,432,831 B2 | 8/2002 | Dhindsa et al. | |
| 6,435,865 B1 | 8/2002 | Tseng et al. | |
| 6,444,039 B1 | 9/2002 | Nguyen | |
| 6,450,117 B1 | 9/2002 | Murugesh et al. | |
| 6,451,119 B2 | 9/2002 | Sneh et al. | |
| 6,454,912 B1 | 9/2002 | Ahn et al. | |
| 6,458,416 B1 | 10/2002 | Derderian et al. | |
| 6,461,436 B1 | 10/2002 | Campbell et al. | |
| 6,461,931 B1 | 10/2002 | Eldridge | |
| 6,475,336 B1 | 11/2002 | Hubacek | |
| 6,486,081 B1 | 11/2002 | Ishikawa et al. | |
| 6,503,330 B1 | 1/2003 | Sneh et al. | |
| 6,506,254 B1 | 1/2003 | Bosch et al. | |
| 6,508,268 B1 | 1/2003 | Kouketsu et al. | |
| 6,509,280 B2 | 1/2003 | Choi | |
| 6,534,007 B1 | 3/2003 | Blonigan et al. | |
| 6,534,395 B2 | 3/2003 | Werkhoven et al. | |
| 6,534,423 B1 | 3/2003 | Turner | |
| 6,540,838 B2 | 4/2003 | Sneh et al. | |
| 6,541,353 B1 | 4/2003 | Sandhu et al. | |
| 6,551,929 B1 | 4/2003 | Kori et al. | |
| 6,562,140 B1 | 5/2003 | Bondestam et al. | |
| 6,562,141 B2 | 5/2003 | Clarke | |
| 6,573,184 B2 | 6/2003 | Park | |
| 6,579,372 B2 | 6/2003 | Park | |
| 6,579,374 B2 | 6/2003 | Bondestam et al. | |
| 6,585,823 B1 | 7/2003 | Van Wijck | |
| 6,592,709 B1 | 7/2003 | Lubomirsky | |
| 6,596,085 B1 | 7/2003 | Schmitt et al. | |
| 6,602,346 B1 | 8/2003 | Gochberg | |
| 6,610,352 B2 | 8/2003 | Cheong et al. | |
| 6,622,104 B2 | 9/2003 | Wang et al. | |
| 6,630,201 B2 | 10/2003 | Chiang et al. | |
| 6,634,314 B2 | 10/2003 | Hwang et al. | |
| 6,635,965 B1 | 10/2003 | Lee et al. | |
| 6,638,672 B2 | 10/2003 | Deguchi | |
| 6,638,879 B2 | 10/2003 | Hsieh et al. | |
| 6,641,673 B2 | 11/2003 | Yang | |
| 6,656,539 B1 * | 12/2003 | Haight et al. | 427/553 |
| 6,663,713 B1 | 12/2003 | Robles et al. | |
| 6,666,982 B2 | 12/2003 | Brcka | |
| 6,673,196 B1 | 1/2004 | Oyabu | |
| 6,676,759 B1 | 1/2004 | Takagi et al. | |
| 6,689,220 B1 | 2/2004 | Nguyen | |
| 6,704,913 B2 | 3/2004 | Rossman | |
| 6,705,345 B1 | 3/2004 | Bifano | |
| 6,706,334 B1 | 3/2004 | Kobayashi et al. | |
| 6,734,020 B2 | 5/2004 | Lu et al. | |
| 6,770,145 B2 | 8/2004 | Saito et al. | |
| 6,800,139 B1 | 10/2004 | Shinriki et al. | |
| 6,807,971 B2 | 10/2004 | Saito et al. | |
| 6,818,249 B2 | 11/2004 | Derderian | |
| 6,821,347 B2 | 11/2004 | Carpenter et al. | |
| 6,830,652 B1 | 12/2004 | Ohmi et al. | |
| 6,838,114 B2 | 1/2005 | Carpenter et al. | |
| 6,845,734 B2 | 1/2005 | Carpenter et al. | |
| 6,849,131 B2 | 2/2005 | Chen et al. | |
| 6,858,120 B2 | 2/2005 | Ahn et al. | |

| | | |
|---|---|---|
| 6,861,094 B2 | 3/2005 | Derderian et al. |
| 6,861,356 B2 | 3/2005 | Matsuse et al. |
| 6,877,726 B1 | 4/2005 | Rindt et al. |
| 6,878,402 B2 * | 4/2005 | Chiang et al. ............... 427/248.1 |
| 6,881,295 B2 | 4/2005 | Nagakura et al. |
| 6,882,406 B2 * | 4/2005 | Kurt et al. ....................... 355/67 |
| 6,887,521 B2 | 5/2005 | Basceri |
| 6,905,547 B1 | 6/2005 | Londergan et al. |
| 6,905,549 B2 | 6/2005 | Okuda et al. |
| 6,966,936 B2 | 11/2005 | Yamasaki et al. |
| 6,991,684 B2 | 1/2006 | Kannan et al. |
| 7,022,184 B2 | 4/2006 | Van Wijck et al. |
| 7,086,410 B2 | 8/2006 | Chouno et al. |
| 7,153,396 B2 | 12/2006 | Genser et al. |
| 7,238,294 B2 * | 7/2007 | Koops et al. ..................... 216/62 |
| 7,311,947 B2 * | 12/2007 | Dando et al. ................... 427/596 |
| 7,389,023 B2 * | 6/2008 | Yeo et al. ......................... 385/37 |
| 7,601,393 B2 * | 10/2009 | Chiang et al. ............... 427/248.1 |
| 2001/0001952 A1 | 5/2001 | Nishizawa et al. |
| 2001/0010309 A1 | 8/2001 | Van Bilsen |
| 2001/0011526 A1 | 8/2001 | Doering et al. |
| 2001/0012697 A1 | 8/2001 | Mikata |
| 2001/0020447 A1 | 9/2001 | Murugesh et al. |
| 2001/0024387 A1 | 9/2001 | Raaijmakers et al. |
| 2001/0029892 A1 | 10/2001 | Cook et al. |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1 | 1/2002 | Park |
| 2002/0016044 A1 | 2/2002 | Dreybrodt et al. |
| 2002/0020353 A1 | 2/2002 | Redemann et al. |
| 2002/0042205 A1 | 4/2002 | McMillin et al. |
| 2002/0043216 A1 | 4/2002 | Hwang et al. |
| 2002/0052097 A1 | 5/2002 | Park |
| 2002/0066411 A1 * | 6/2002 | Chiang et al. .................. 118/724 |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0088547 A1 | 7/2002 | Tomoyasu et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0110991 A1 | 8/2002 | Li |
| 2002/0127745 A1 | 9/2002 | Lu et al. |
| 2002/0129768 A1 | 9/2002 | Carpernter et al. |
| 2002/0132374 A1 | 9/2002 | Basceri et al. |
| 2002/0144655 A1 | 10/2002 | Chiang et al. |
| 2002/0146512 A1 | 10/2002 | Rossman |
| 2002/0162506 A1 | 11/2002 | Sneh et al. |
| 2002/0164420 A1 | 11/2002 | Derderian et al. |
| 2002/0185067 A1 | 12/2002 | Upham |
| 2002/0195056 A1 | 12/2002 | Sandhu et al. |
| 2002/0195145 A1 | 12/2002 | Lowery et al. |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0013320 A1 | 1/2003 | Kim et al. |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0027431 A1 | 2/2003 | Sneh et al. |
| 2003/0031794 A1 | 2/2003 | Tada et al. |
| 2003/0037729 A1 | 2/2003 | DeDontney et al. |
| 2003/0049372 A1 | 3/2003 | Cook et al. |
| 2003/0060030 A1 | 3/2003 | Lee et al. |
| 2003/0066483 A1 | 4/2003 | Lee et al. |
| 2003/0066609 A1 | 4/2003 | Campbell et al. |
| 2003/0070617 A1 | 4/2003 | Kim et al. |
| 2003/0070618 A1 | 4/2003 | Campbell et al. |
| 2003/0075273 A1 | 4/2003 | Kilpela et al. |
| 2003/0079686 A1 | 5/2003 | Chen et al. |
| 2003/0090676 A1 | 5/2003 | Goebel et al. |
| 2003/0094903 A1 | 5/2003 | Tao et al. |
| 2003/0098372 A1 | 5/2003 | Kim |
| 2003/0098419 A1 | 5/2003 | Ji et al. |
| 2003/0106490 A1 | 6/2003 | Jallepally et al. |
| 2003/0121608 A1 | 7/2003 | Chen et al. |
| 2003/0159780 A1 | 8/2003 | Carpenter et al. |
| 2003/0185979 A1 | 10/2003 | Nelson |
| 2003/0192645 A1 | 10/2003 | Liu |
| 2003/0194862 A1 | 10/2003 | Mardian et al. |
| 2003/0200926 A1 | 10/2003 | Dando et al. |
| 2003/0203109 A1 | 10/2003 | Dando et al. |
| 2003/0213435 A1 | 11/2003 | Okuda et al. |
| 2003/0232892 A1 | 12/2003 | Guerra-Santos et al. |
| 2004/0000270 A1 | 1/2004 | Carpenter et al. |
| 2004/0003777 A1 | 1/2004 | Carpenter et al. |
| 2004/0007188 A1 | 1/2004 | Burkhart et al. |
| 2004/0025733 A1 * | 2/2004 | Kurt et al. ....................... 101/494 |
| 2004/0025786 A1 | 2/2004 | Kontani et al. |
| 2004/0035358 A1 | 2/2004 | Basceri et al. |
| 2004/0040502 A1 | 3/2004 | Basceri et al. |
| 2004/0040503 A1 | 3/2004 | Basceri et al. |
| 2004/0083959 A1 | 5/2004 | Carpenter et al. |
| 2004/0083960 A1 | 5/2004 | Dando |
| 2004/0083961 A1 | 5/2004 | Basceri |
| 2004/0089240 A1 | 5/2004 | Dando et al. |
| 2004/0094095 A1 | 5/2004 | Huang et al. |
| 2004/0099377 A1 | 5/2004 | Newton et al. |
| 2004/0124131 A1 | 7/2004 | Aitchison et al. |
| 2004/0154538 A1 | 8/2004 | Carpenter et al. |
| 2004/0226507 A1 | 11/2004 | Carpenter et al. |
| 2004/0226516 A1 | 11/2004 | Daniel et al. |
| 2004/0238123 A1 | 12/2004 | Becknell et al. |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0048742 A1 | 3/2005 | Dip et al. |
| 2005/0059261 A1 | 3/2005 | Basceri et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian |
| 2005/0103275 A1 | 5/2005 | Sasaki et al. |
| 2005/0217582 A1 | 10/2005 | Kim et al. |
| 2006/0237138 A1 | 10/2006 | Qin |
| 2009/0220381 A1 * | 9/2009 | McGimpsey ................ 422/68.1 |
| 2010/0136245 A1 * | 6/2010 | Albano et al. ................ 427/446 |
| 2010/0143847 A1 * | 6/2010 | Afzali-Ardakani et al. .. 430/311 |

FOREIGN PATENT DOCUMENTS

| | | | |
|---|---|---|---|
| DE | 198 51 824 A1 | | 5/2000 |
| EP | 140246 | | 5/1985 |
| EP | 740490 | | 10/1996 |
| EP | 1 167 569 A1 | | 1/2002 |
| GB | 1065762 | | 4/1967 |
| GB | 1469230 | | 4/1977 |
| JP | 55-108944 | * | 8/1980 |
| JP | 60054443 | | 3/1985 |
| JP | 61292894 | | 12/1986 |
| JP | 62235728 | | 10/1987 |
| JP | 62263629 | | 11/1987 |
| JP | 63020490 | | 1/1988 |
| JP | 63-52134 A | * | 3/1988 |
| JP | 63111177 | | 5/1988 |
| JP | 63234198 | | 9/1988 |
| JP | 63-256460 A | | 10/1988 |
| JP | 63259067 | | 10/1988 |
| JP | 6481311 | | 3/1989 |
| JP | 1-273991 A | | 11/1989 |
| JP | 02-208925 A | * | 8/1990 |
| JP | 2306591 | | 12/1990 |
| JP | 03174717 | | 7/1991 |
| JP | 04-64225 | * | 2/1992 |
| JP | 04-69933 | * | 3/1992 |
| JP | 4-100533 A | | 4/1992 |
| JP | 4-213818 A | | 8/1992 |
| JP | 05-24975 | * | 2/1993 |

| | | | |
|---|---|---|---|
| JP | 05102025 | | 4/1993 |
| JP | 6-151558 A | | 5/1994 |
| JP | 06-172979 | * | 6/1994 |
| JP | 06201539 | | 7/1994 |
| JP | 06202372 | | 7/1994 |
| JP | 6-342785 A | | 12/1994 |
| JP | 7263144 | | 10/1995 |
| JP | 8-34678 A | | 2/1996 |
| JP | 08-179307 | * | 7/1996 |
| JP | 9-82650 A | | 3/1997 |
| JP | 09082650 | | 3/1997 |
| JP | 10008255 | | 1/1998 |
| JP | 10-200091 | * | 7/1998 |
| JP | 10-223719 A | | 8/1998 |
| JP | 11-172438 A | | 6/1999 |
| JP | 2001-82682 A | | 3/2001 |
| JP | 2001-261375 A | | 9/2001 |
| JP | 2002-164336 A | | 6/2002 |
| JP | 2001-254181 A | | 9/2002 |
| SU | 598630 | | 3/1978 |
| WO | WO-98/37258 A1 | | 8/1998 |
| WO | WO-99/06610 A1 | | 2/1999 |
| WO | WO-00/40772 A1 | | 7/2000 |
| WO | WO-00/63952 A1 | | 10/2000 |
| WO | WO-00/65649 A1 | | 11/2000 |
| WO | WO-00/79019 A1 | | 12/2000 |
| WO | 0132966 | | 5/2001 |
| WO | WO-01/46490 A1 | | 6/2001 |
| WO | WO-02/45871 A1 | | 6/2002 |
| WO | WO-02/48427 A1 | | 6/2002 |
| WO | WO-02/073329 A2 | | 9/2002 |
| WO | WO-02/073660 A2 | | 9/2002 |
| WO | WO-02/081771 A2 | | 10/2002 |
| WO | WO-02/095807 A2 | | 11/2002 |
| WO | WO-03/008662 A2 | | 1/2003 |
| WO | WO-03/016587 A1 | | 2/2003 |
| WO | WO-03/028069 A2 | | 4/2003 |
| WO | WO-03/033762 A1 | | 4/2003 |
| WO | WO-03/035927 A2 | | 5/2003 |
| WO | WO-03/052807 A1 | | 6/2003 |

OTHER PUBLICATIONS

Translation of Obata et al., JP 10-200091 A, published Jul. 31, 1998.*
Translation of Gartner et al., DE4003882 A1, published Aug. 14, 1991.*
Translation of Yasuo Takahashi et al., JP 02-208925 A, published Aug. 20, 1990.*
U.S. Appl. No. 10/767,298, filed Jan. 28, 2004, Zheng et al.
U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/839,316, filed May 5, 2005, Saragiannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/859,883, filed Jun. 2, 2004, Miller et al.
U.S. Appl. No. 10/733,523, filed Oct. 10, 2003, Beaman et al.
U.S. Appl. No. 11/027,809, filed Dec. 29, 2004, Carpenter et al.
U.S. Appl. No. 09/651,037, filed Aug. 30, 2000, Mardian.
U.S. Appl. No. 10/365,085, filed Feb. 11, 2003, Carpenter et al.
U.S. Appl. No. 10/665,908, filed Sep. 18, 2003, Sarigiannis et al.
Integrated Process Systems Ltd., "ALD & CVD", 2 pages, retrieved from the Internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.
Cutting Edge Optronics, 600W QCW Laser Diode Array, Part No. ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.
Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).
Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, Transducers '97: 1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.
Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.
Cowin, J.P., et al., "Measurement of Fast Desorption Kinetics of D2 From Tungsten by Laser Induced Thermal Desorption," Surface Science, vol. 78, pp. 545-564, 1978, North-Holland Publishing Company.
Ready, J.F., "Effects Due to Absorption of Laser Radiation," Journal of Applied Physics, vol. 36, No. 2, pp. 462-468, Feb. 1965, Journal of Applied Physics, American Institute of Physics.
Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.
Tokyo Electron Limited, Plasma Process System, Trias SPA, 1 page, retrieved from the Internet on Oct. 16, 2004, <http://www.tel.com/eng/products/spe/sdtriasspa.htm>.
Olsson, A., "Valve-less Diffuser Micropumps", ISSN 0281-2878, 66 pages, 1998.
Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.
Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.
Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA, 1998), pp. 1-11.
Henning, A.K., "Microfluidic MEMS," Proceedings, IEEE Aerospace Conference, Paper 4.906 (IEEE Press, Piscataway, NJ, 1998), 16 pages.
Peters, L., "Thermal Processing's Tool of Choice: Single-Wafer RTP or Fast Ramp Batch!", Semiconductor International, Apr. 1, 1998, 8 pages, <http://www.e-incite.net/semiconductor/index.asp!alyout=article&articleid=CA163937>.
The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.
Deublin Company, "Sealing," 2 pages, retrieved from the Internet on Feb. 4, 2002, <http://www.deublin.com/products/sealing.htm>.
Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.
Integrated Process Systems Ltd., "Nano-ALD", 2 pages, retrieved from the Internet on Dec. 11, 2001, <http://www.ips-tech.com/eng/pro-p2.htm>.
Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

Aera Corporation, "Fundamentals of Mass Flow Control," 1 page, retrieved from the Internet on Mar. 6, 2003, <http://www.aeramfc.com/funda.shtml>.

Eguchi, K. et al., "Composition Self-Matching Phenomena in Chemical Vapor Deposition of (Ba,Sr)TiO3 Thin Films," Electrochemical Society Proceedings vol. 98-3, pp. 179-189.

EMOC Flow Systems, "Mach One Mass Flow Controllers", 1 page, retrieved from the Internet on Nov. 7, 2003, <http://emcoflow.com/mach-one.htm>.

EMCO Flow Systems, Mach One Mass Flow Controller Product Brochure, 6 pages, retrieved from the Internet on Nov. 7, 2003, <http://www.emcoflow.com/literature/brochures_product_sheets/mach_one/mach_one_brochure_2_01.pdf>.

Kawahara, T. et al., "Step Coverage and Electrical Properties of (BA,Sr)TiO3 Films Prepared by Liquid Source Chemical Vapor Deposition," Electrochemical Society Proceedings, vol. 98-3, pp. 190-195.

MKS Instruments, ASTeX® Microwave Plasma Sources and Subsystems, 1 page, retrieved from the Internet on Nov. 19, 2004, <http://www.mksinst.com/PRG2.html>.

MKS Instruments, Data Sheet, Downstream Plasma Source, Type AX7610, 4 pages, Dec. 2002, <http://www.mksinst.com/docs/UR/ASTEXax7610DS.pdf>.

SemiZone, "EMCO Flow Systems Granted Patent for the Mach One Mass Flow Controller for the Semiconductor Industry (Jun. 28, 2001)", 2 pages, retrieved from the Internet on Nov. 7, 2003, <http://www.semizone.com/news/item!news_item_id=100223>.

Wright, D.R., et. al., "Maufacturing issues of electrostatic chucks," J. Vac. Sci. Technol. B 13(4), pp. 1910-1916, Jul./Aug. 1995, American Vacuum Society.

* cited by examiner

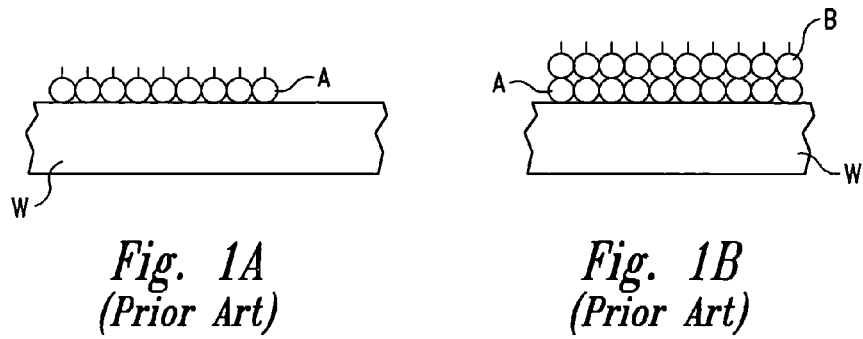
Fig. 1A
(Prior Art)
Fig. 1B
(Prior Art)
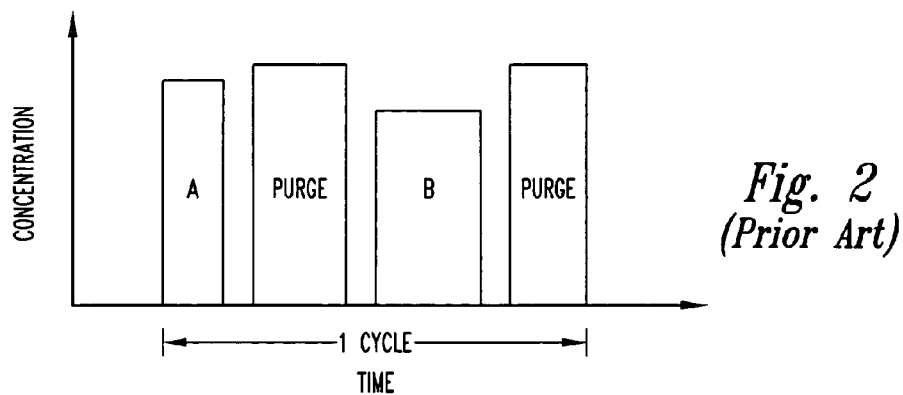
Fig. 2
(Prior Art)
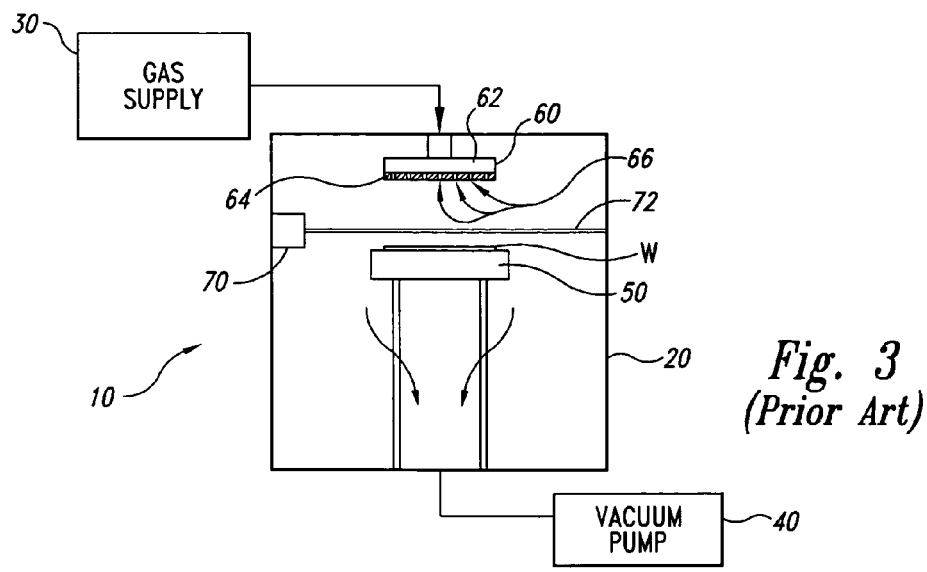
Fig. 3
(Prior Art)

METHODS FOR DEPOSITING MATERIAL ONTO MICROFEATURE WORKPIECES IN REACTION CHAMBERS AND SYSTEMS FOR DEPOSITING MATERIALS ONTO MICROFEATURE WORKPIECES

TECHNICAL FIELD

The present invention is related to methods for depositing material onto microfeature workpieces in reaction chambers and systems for depositing materials onto microfeature workpieces. More particularly, the present invention is related to methods for irradiating a portion of a microfeature workpiece to desorb or activate molecules in that portion of the workpiece.

BACKGROUND

Thin film deposition techniques are widely used in the manufacturing of microfeatures to form a coating on a workpiece that closely conforms to the surface topography. The size of the individual components in the workpiece is constantly decreasing, and the number of layers in the workpiece is increasing. As a result, both the density of components and the aspect ratios of depressions (i.e., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors capable of reacting to form a solid thin film are mixed while in a gaseous or vaporous state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Atomic Layer Deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. Referring to FIG. 1B, the layer of A molecules is then exposed to another precursor gas containing B molecules. The A molecules react with the B molecules to form an extremely thin layer of solid material on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. In actual processing, several cycles are repeated to build a thin film on a workpiece having the desired thickness. For example, each cycle may form a layer having a thickness of approximately 0.5-1.0 Å, and thus several cycles are required to form a solid layer having a thickness of approximately 60 Å.

One drawback of ALD processing is that it has a relatively low throughput compared to CVD techniques. For example, each A-purge-B-purge cycle can take several seconds. This results in a total process time of several minutes to form a single thin layer of only 60 Å. In contrast to ALD processing, CVD techniques require only about one minute to form a 60 Å thick layer. The low throughput limits the utility of the ALD technology in its current state because ALD may create a bottleneck in the overall manufacturing process.

FIG. 3 schematically illustrates a single-wafer CVD/ALD reactor 10 having a reaction chamber 20 coupled to a gas supply 30 and a vacuum pump 40. The reactor 10 also includes a gas dispenser 60 and a heater 50 for supporting the workpiece W in the reaction chamber 20. The gas dispenser 60 includes a plenum 62 operably coupled to the gas supply 30 and a distributor plate 64 having a plurality of holes 66. In operation, the heater 50 heats the workpiece W to a desired temperature, and the gas supply 30 selectively injects the precursors as described above. The vacuum pump 40 maintains a negative pressure in the reaction chamber 20 to draw the gases from the gas dispenser 60 across the workpiece W and then through an outlet of the chamber 20.

In photoselective CVD processing, the reaction chamber 20 may further include a laser 70 configured to generate a laser beam 72 for activating at least one of the precursors. The laser 70 produces the laser beam 72 along a beam path generally parallel to the workpiece W, with the laser beam 72 positioned between the gas dispenser 60 and the workpiece W to selectively activate a precursor(s) before the precursor(s) is deposited onto the workpiece W. The activated precursor(s) subsequently reacts with other precursors on the surface of the workpiece W to form a solid thin film.

In addition to CVD and ALD processing, other processing steps are necessary to form features and devices on workpieces. For example, conventional processing includes patterning a design onto a workpiece, etching unnecessary material from the workpiece, depositing selected material onto the workpiece, and planarizing the surface of the workpiece. These additional processing steps are expensive and time-consuming. Accordingly, a need exists to improve the efficiency with which features are formed on workpieces.

BRIEF DESCRIPTION OF THE DRAWINGS

FIGS. 1A and 1B are schematic cross-sectional views of stages in ALD processing in accordance with the prior art.

FIG. 2 is a graph illustrating a cycle for forming a layer using ALD techniques in accordance with the prior art.

FIG. 3 is a schematic representation of a system including a reaction chamber for depositing materials onto a microfeature workpiece in accordance with the prior art.

FIG. 5A is a schematic side cross-sectional view of a portion of the workpiece after depositing a layer of first molecules onto a surface of the workpiece.

FIG. 5B is a schematic side cross-sectional view of the workpiece after desorbing a selected portion of the first molecules.

FIG. 5C is a schematic side cross-sectional view of the workpiece after depositing a layer of second molecules onto the workpiece.

FIG. 6A is a schematic side cross-sectional view of a portion of the workpiece after depositing a layer of first molecules onto a surface of the workpiece.

FIG. 6B is a schematic side cross-sectional view of the workpiece after with the laser desorbing selected first molecules from a portion of the workpiece.

FIG. 6C is a schematic side cross-sectional view of the workpiece after depositing second molecules onto the workpiece.

FIG. 6D is a schematic side cross-sectional view of the workpiece after desorbing a selected portion of the second molecules.

FIG. 7A is a schematic side cross-sectional view of a portion of the workpiece after depositing a layer of first molecules onto the workpiece.

FIG. 7B is a schematic side cross-sectional view of the workpiece after depositing a plurality of second molecules onto the workpiece.

FIG. 7C a schematic side cross-sectional view of the workpiece after removing the nonreacted second molecules from the workpiece.

DETAILED DESCRIPTION

A. Overview

Figure 4:
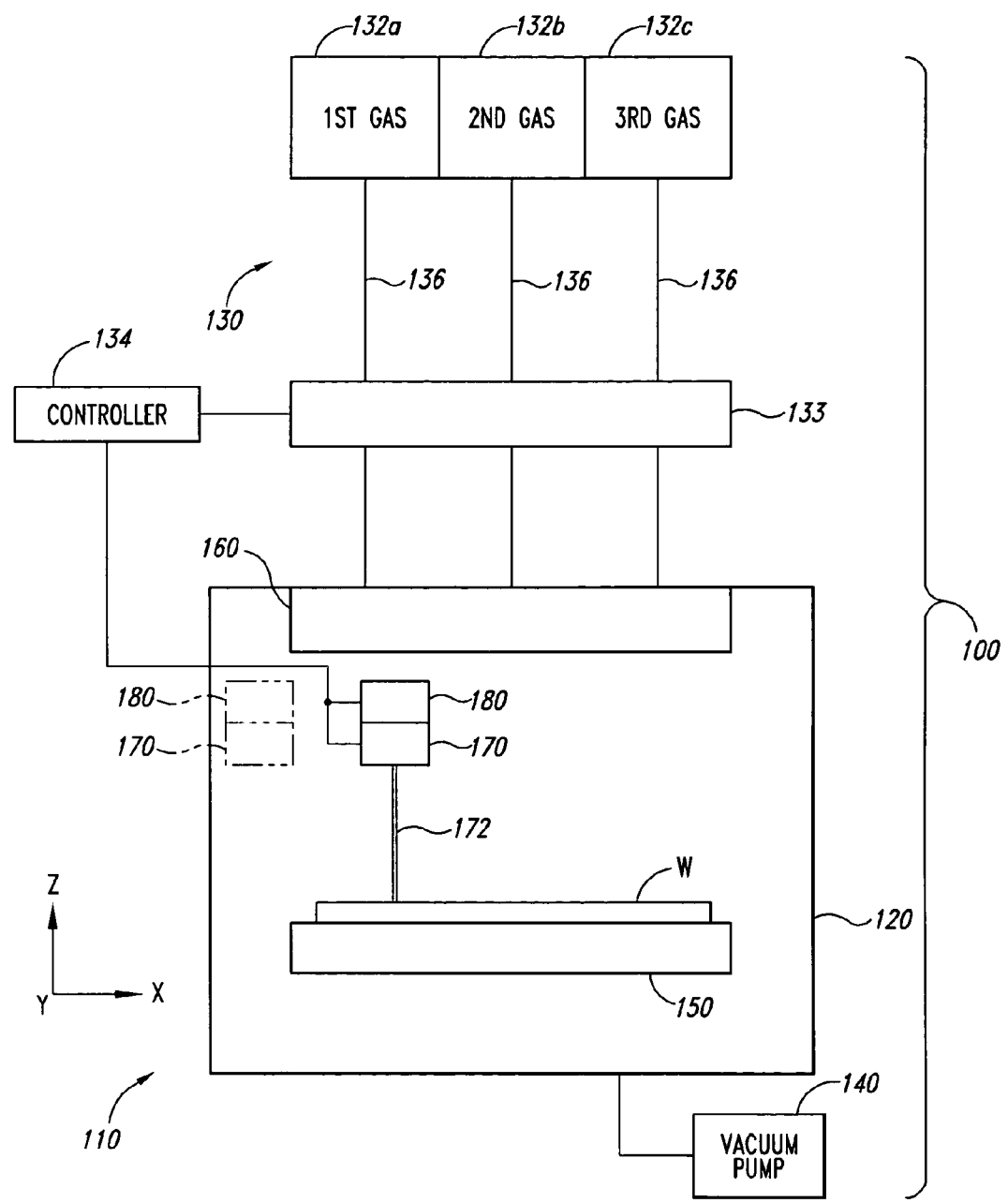
FIG. 4 is a schematic representation of a system for depositing materials onto a microfeature workpiece in accordance with one embodiment of the invention.

The following disclosure describes several embodiments of systems for depositing materials onto microfeature workpieces, and methods for depositing materials onto workpieces in reaction chambers. Many specific details of the invention are described below with reference to single-wafer reaction chambers for depositing materials onto microfeature workpieces, but several embodiments can be used in batch systems for processing a plurality of workpieces simultaneously. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-9 and the following text to provide a thorough understanding of particular embodiments of the invention. A person skilled in the art will understand, however, that the invention may have additional embodiments, or that the invention may be practiced without several of the details of the embodiments shown in FIGS. 4-9.

Several aspects of the invention are directed to methods for depositing materials onto microfeature workpieces in a reaction chamber. In one embodiment, a method includes depositing molecules of a gas onto a microfeature workpiece in the reaction chamber and selectively irradiating a first portion of the molecules on the microfeature workpiece in the reaction chamber with a selected radiation without irradiating a second portion of the molecules on the workpiece with the selected radiation. The first portion of the molecules can be irradiated to activate the molecules or desorb the molecules from the workpiece. The first portion of the molecules can be selectively irradiated by impinging the molecules with a laser beam or another energy source.

In another embodiment, a method includes depositing first molecules of a first gas onto the microfeature workpiece in the reaction chamber, directing a laser beam toward a first portion of the first molecules to desorb the first portion of the first molecules without desorbing a second portion of the first molecules, and depositing second molecules of a second gas onto the second portion of the first molecules. The first and second gases can have generally the same or different compositions. The method can further include directing the laser beam toward a first portion of the second molecules to desorb the first portion of the second molecules without directing the laser beam toward a second portion of the second molecules.

In another embodiment, a method includes depositing first molecules of a first gas onto the microfeature workpiece in the reaction chamber, directing a laser beam toward a selected portion of the first molecules to activate the selected portion of the first molecules to react with second molecules of a second gas, and depositing the second molecules of the second gas onto the selected portion of the first molecules. The first and second gases can have the same or different compositions. The method can further include purging excess first gas from the reaction chamber before depositing molecules of the second gas.

Other aspects of the invention are directed to systems for depositing materials onto a surface of a microfeature workpiece. In one embodiment, a system includes a gas supply assembly having a gas source, a gas phase reaction chamber for carrying the microfeature workpiece, a gas distributor carried by the reaction chamber and coupled to the gas supply assembly, an energy source positioned to selectively irradiate portions of the microfeature workpiece, and a controller operably coupled to the energy source and the gas supply assembly. The controller has a computer-readable medium containing instructions to perform one of the above-mentioned methods.

B. Embodiments of Deposition Systems

FIG. 4 is a schematic representation of a system 100 for depositing materials onto a microfeature workpiece W in accordance with one embodiment of the invention. In this embodiment, the system 100 includes a reactor 110 having a reaction chamber 120 coupled to a gas supply 130 and a vacuum pump 140. The reactor 110 also includes a gas distributor 160 coupled to the gas supply 130 to dispense gas(es) into the reaction chamber 120 and onto the workpiece W. Byproducts including excess and/or unreacted gas molecules are removed from the reaction chamber 120 by the vacuum pump 140 and/or by injecting a purge gas into the chamber 120.

The gas supply 130 includes a plurality of gas sources 132 (shown schematically and identified individually as 132a-c) and a plurality of gas lines 136 coupled to corresponding gas sources 132. The gas sources 132 can include a first gas source 132a for providing a first gas, a second gas source 132b for providing a second gas, and a third gas source 132c for providing a third gas. The first and second gases can be first and second precursors, respectively. The third gas can be a purge gas. The first and second precursors are the gas and/or vapor phase constituents that react to form the thin, solid layer on the workpiece W. The purge gas can be a suitable type of gas that is compatible with the reaction chamber 120 and the workpiece W. In other embodiments, the gas supply 130 can include a different number of gas sources 132 for applications that require additional precursors or purge gases.

The system 100 of the illustrated embodiment further includes a valve assembly 133 (shown schematically) coupled to the gas lines 136 and a controller 134 (shown schematically) operably coupled to the valve assembly 133. The controller 134 generates signals to operate the valve assembly 133 to control the flow of gases into the reaction chamber 120 for ALD and CVD applications. For example, the controller 134 can be programmed to operate the valve assembly 133 to pulse the gases individually through the gas distributor 160 in ALD applications or to mix selected precursors in the gas distributor 160 in CVD applications. More specifically, in one embodiment of an ALD process, the controller 134 directs the valve assembly 133 to dispense a pulse of the first gas (e.g., the first precursor) into the reaction chamber 120. Next, the controller 134 directs the valve assembly 133 to dispense a pulse of the third gas (e.g., the purge gas) to purge excess molecules of the first gas from the reaction chamber 120. The controller 134 then directs the valve assembly 133 to dispense a pulse of the second gas (e.g., the second precursor), followed by a pulse of the third gas. In one embodiment of a pulsed CVD process, the controller 134 directs the valve assembly 133 to dispense a pulse of the first and second gases (e.g., the first and second precursors) into the reaction chamber 120. Next, the controller 134 directs the valve assembly 133 to dispense a pulse of the third gas (e.g., the purge gas) into the reaction chamber 120. In other embodiments, the controller 134 can dispense the gases in other sequences.

In the illustrated embodiment, the reactor 110 also includes a workpiece support 150 to hold the workpiece W in the reaction chamber 120. The workpiece support 150 can be heated to bring the workpiece W to a desired temperature for catalyzing the reaction between the first gas and the second gas at the surface of the workpiece W. For example, the workpiece support 150 can be a plate with a heating element. The workpiece support 150, however, may not be heated in other applications.

The illustrated reaction chamber 120 further includes a laser 170 (shown schematically) operably coupled to the controller 134 for producing a laser beam 172 to irradiate selected portions of the workpiece W. The laser beam 172 provides sufficient localized energy to desorb or activate the irradiated molecules on the workpiece W. For example, after a layer of material has been deposited onto the workpiece W, the laser 170 can direct the laser beam 172 toward a selected portion of the material to desorb or activate the material, as described in greater detail below. Depending on the material, the power required for desorption can be on the order of 1e6 W/cm$^2$. Accordingly, in several embodiments, the laser 170 can be a stand-alone laser system; and in other embodiments, the laser 170 can include one or more laser diodes. For example, suitable laser diodes include a 600 W QCW Laser Diode Array, part number ARR48P600, manufactured by Cutting Edge Optronics in St. Charles, Mo. In additional embodiments, the reaction chamber 120 may include an energy source in lieu of a laser to heat a localized portion of the workpiece W for desorbing or activating selected molecules.

The reactor 110 may further include a positioning device 180 (shown schematically) coupled to the laser 170 and operably coupled to the controller 134 for moving the laser 170 and aligning the laser beam 172 with the selected portion of the workpiece W. For example, the positioning device 180 can move the laser 170 from a stowed position (shown in hidden lines) to a deployed position (shown in solid lines) for irradiating the selected portion of the workpiece W. In the stowed position, the laser 170 and the positioning device 180 are arranged so as not to interfere with the flow of gases from the gas distributor 160 to the workpiece W. The positioning device 180 can be configured to move the laser 170 side to side (e.g., X direction) and forward and backward (e.g., Y direction) to align the laser beam 170 with the selected portion of the workpiece W. Alternatively, the positioning device 180 may also be able to move the laser 170 upward and downward (e.g., Z direction). The positioning device 180 can accordingly have an articulating arm, a telescoping arm, or other type of structure to support the laser 170 over the workpiece W. The positioning device 180 can further include an actuator to move the arm. In other embodiments, such as those described below with reference to FIGS. 8 and 9, the reactor may not include a positioning device coupled to the laser.

C. Embodiments of Methods for Depositing Materials onto Workpieces

Figure 5A:
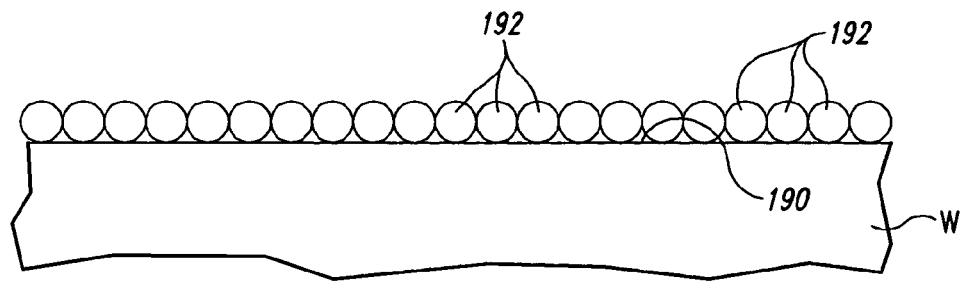
FIGS. 5A-5C illustrate stages in an ALD process in which a laser desorbs material from a workpiece in accordance with another embodiment of the invention.
Figure 5B:
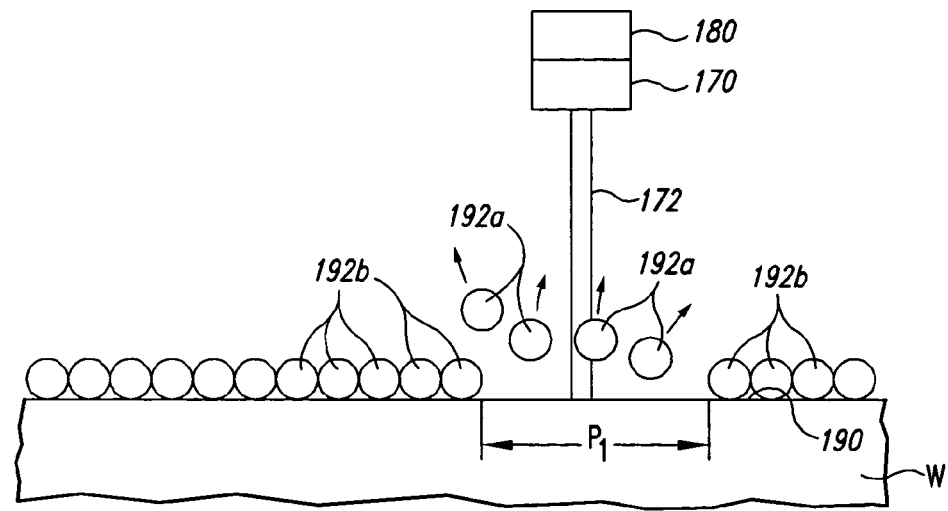
Figure 5C:
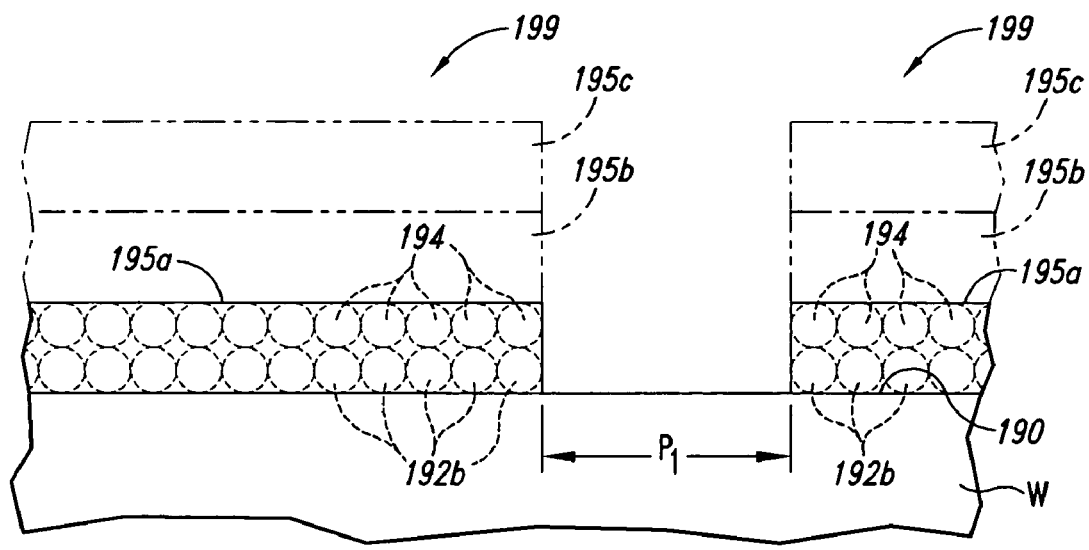

FIGS. 5A-5C illustrate stages in an ALD process in which the laser 170 desorbs material from the workpiece W in accordance with one embodiment of the invention. FIG. 5A, more specifically, is a schematic side cross-sectional view of a portion of the workpiece W after dispensing a pulse of a first gas into the reaction chamber 120 (FIG. 4) and depositing a layer of first molecules 192 from the first gas onto a surface 190 of the workpiece W. FIG. 5B is a schematic side cross-sectional view of the workpiece W with the laser beam 172 impinging a selected portion P$_1$ of the workpiece W. After depositing the first molecules 192 onto the workpiece W, the positioning device 180 aligns the laser 170 with the selected portion P$_1$ of the workpiece W and the laser 170 directs the laser beam 172 toward selected first molecules 192a. The power, wavelength, and other laser beam parameters are selected based on the chemistry of the first molecules 192 so that the energy from the laser beam 172 breaks the bonds securing the selected first molecules 192a to the surface 190 and, consequently, desorbs the selected first molecules 192a from the workpiece W. As the laser 170 moves across the workpiece W, the laser beam 172 impinges the selected first molecules 192a without impinging a plurality of nonselected first molecules 192b. Consequently, the nonselected first molecules 192b remain physisorbed and/or chemisorbed to the surface 190 of the workpiece W.

After irradiating the portion $P_1$ of the workpiece W, a purge gas can be dispensed into the reaction chamber 120 (FIG. 4) to remove the desorbed first molecules 192a and the excess first gas molecules from the chamber 120. Alternatively, the purge gas can be dispensed into the reaction chamber 120 while the portion $P_1$ of the workpiece W is irradiated. In other embodiments, the desorbed first molecules 192a can be removed from the reaction chamber 120 without injecting a purge gas by drawing the molecules 192a from the chamber 120 with the vacuum pump 140 (FIG. 4). In additional embodiments, the desorbed first molecules 192a can be removed from the reaction chamber 120 as a second gas is subsequently injected into the chamber 120 and deposited onto the workpiece W.

FIG. 5C is a schematic side cross-sectional view of the workpiece W after dispensing a pulse of a second gas into the reaction chamber 120 (FIG. 4) and depositing a layer of second molecules 194 from the second gas onto the workpiece W. The second molecules 194 react with the first molecules 192b to form a discrete film 195a on the workpiece W.

The first and second gases can have the same or different compositions. For example, in one embodiment, the composition of the second molecules 194 can be chosen such that the second molecules 194 adhere to the nonirradiated first molecules 192b but do not adhere to the exposed portion $P_1$ of the surface 190. Suitable gases for such an embodiment include TMA for the first gas and $O_3$ for the second gas, although other gases can be used. In other embodiments, the second molecules 194 can adhere to the exposed portion $P_1$ of the surface 190 in addition to the nonirradiated first molecules 192b. If some of the second molecules 194 adhere to the exposed portion $P_1$ of the surface 190, the laser 170 (FIG. 4) can optionally irradiate and desorb these molecules. In either case, after depositing the second molecules 194 onto the workpiece W, the reaction chamber 120 can be purged and the process can be repeated to build additional layers (shown in hidden lines as 195b and 195c) on the workpiece W.

In additional embodiments, the laser 170 can irradiate the selected portion $P_1$ of the workpiece W only after the second molecules 194 have been deposited onto the workpiece W. For example, in one method, the first molecules 192 are deposited across the workpiece W, and then the reaction chamber 120 can be optionally purged. Next, the second molecules 194 are deposited across the workpiece W, and then the laser 170 irradiates the selected portion $P_1$ of the workpiece W to desorb the selected first and second molecules.

One advantage of the method illustrated in FIGS. 5A-5C is the ability to form features 199, such as conductive lines, on the workpiece W during an ALD process. Forming features 199 on the workpiece W during the deposition process simplifies and reduces the number of subsequent production steps required to construct devices on the workpiece W. For example, by forming the features 199 on the illustrated workpiece W during an ALD process, post-deposition processing, including masking, etching, depositing material, and planarizing, may be reduced and/or eliminated.

Figure 6A:
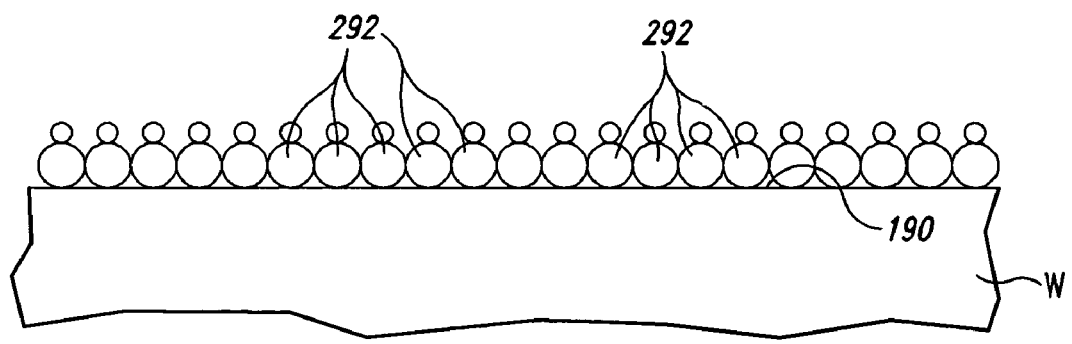
FIGS. 6A-6D illustrate stages in a CVD process in which the laser desorbs material from a workpiece in accordance with another embodiment of the invention.
Figure 6B:
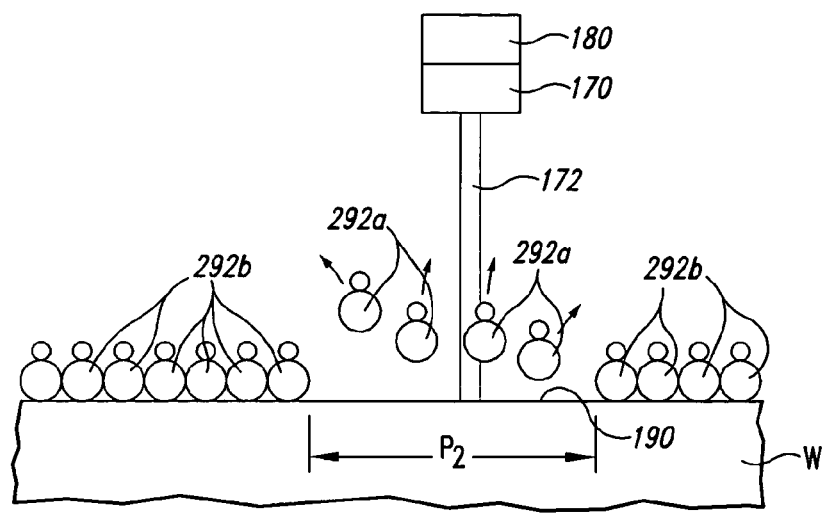

FIGS. 6A-6D illustrate stages in a CVD process in which the laser 170 desorbs material from the workpiece W in accordance with another embodiment of the invention. FIG. 6A, more specifically, is a schematic side cross-sectional view of a portion of the workpiece W after dispensing a pulse of one or more precursors into the reaction chamber 120 (FIG. 4), mixing the precursors to form a gas, and depositing a layer of first molecules 292 from the gas onto the surface 190 of the workpiece W. FIG. 6B is a schematic side cross-sectional view of the workpiece W with the laser 170 directing the laser beam 172 toward selected first molecules 292a to desorb the molecules 292a from a portion $P_2$ of the workpiece W. As the laser 170 moves across the workpiece W, the laser beam 172 does not impinge and desorb a plurality of nonselected molecules 292b. After desorption, the selected first molecules 292a can be removed from the reaction chamber 120 by dispensing a purge gas into the chamber 120 and/or drawing the desorbed molecules 292a from the chamber 120 with the vacuum pump 140 (FIG. 4). Alternatively, the purge gas can be dispensed into the reaction chamber 120 while the portion $P_2$ of the workpiece W is irradiated.

Figure 6C:
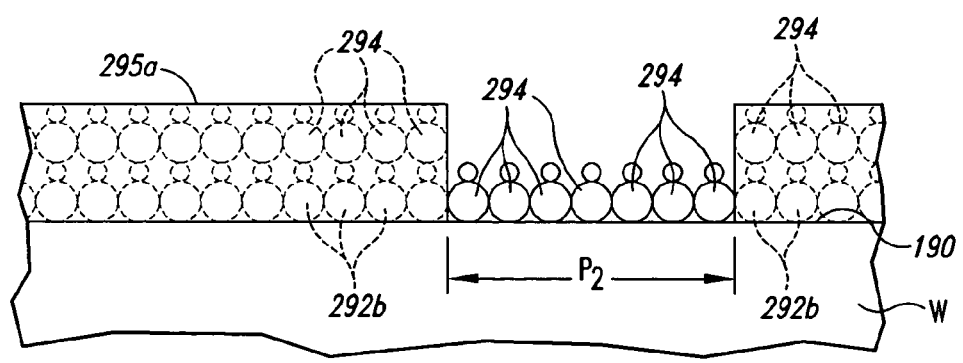

FIG. 6C is a schematic side cross-sectional view of the workpiece W after dispensing another pulse of the precursors into the reaction chamber 120 (FIG. 4), mixing the precursors to form the gas, and depositing a plurality of second molecules 294 of the gas onto the workpiece W. The second molecules 294 are deposited onto the nonirradiated molecules 292b and the exposed portion $P_2$ of the workpiece W. The second molecules 294 proximate to the first molecules 292b react with the first molecules 292b to form a discrete film 295a on the workpiece W.

Figure 6D:
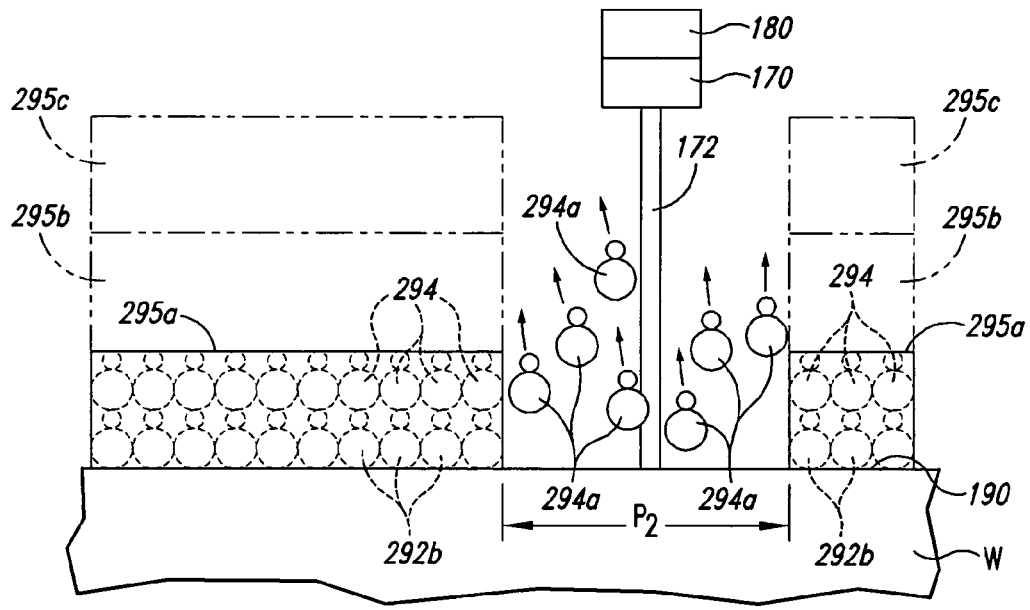

FIG. 6D is a schematic side cross-sectional view of the workpiece W with the laser 170 directing the laser beam 172 toward selected second molecules 294a to desorb the selected molecules 294a from the portion $P_2$ of the workpiece W. After desorbing the selected second molecules 294a, the process can be repeated to build additional layers (shown in hidden lines as 295b and 295c) on the workpiece W. In other embodiments, the selected second molecules 294a may not be desorbed from the workpiece W or may be desorbed during subsequent process steps.

In additional embodiments, more than one layer of molecules can be desorbed during a single irradiation cycle. For example, in one-method, a layer of first molecules 292 can be deposited onto the workpiece W, a layer of second molecules 294 can be deposited onto the workpiece W, and then the laser beam 172 can desorb the selected first and second molecules 292a and 294a from the workpiece W.

Figure 7A:
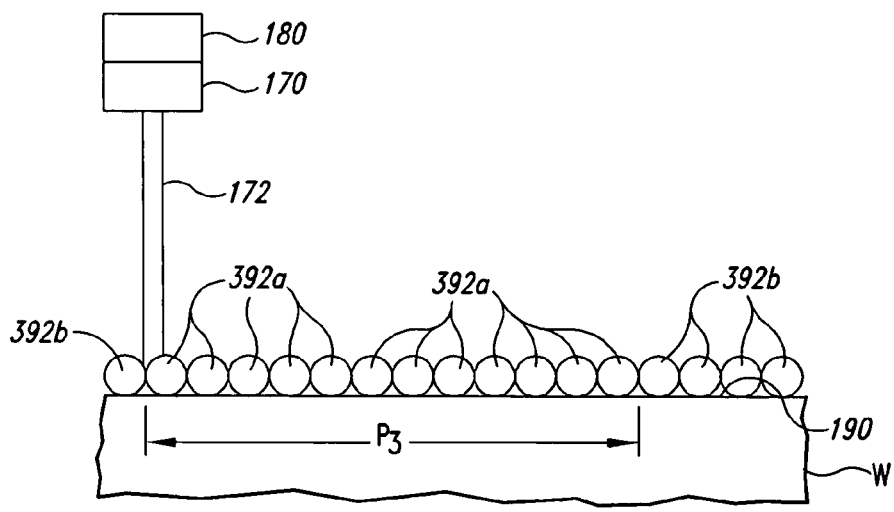
FIGS. 7A-7C illustrate stages in an ALD process in which the laser activates molecules on a workpiece in accordance with another embodiment of the invention.
Figure 7B:
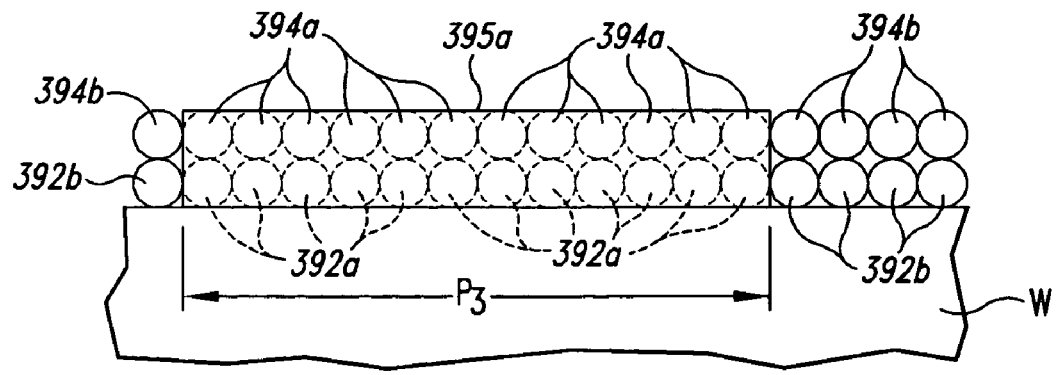
Figure 7C:
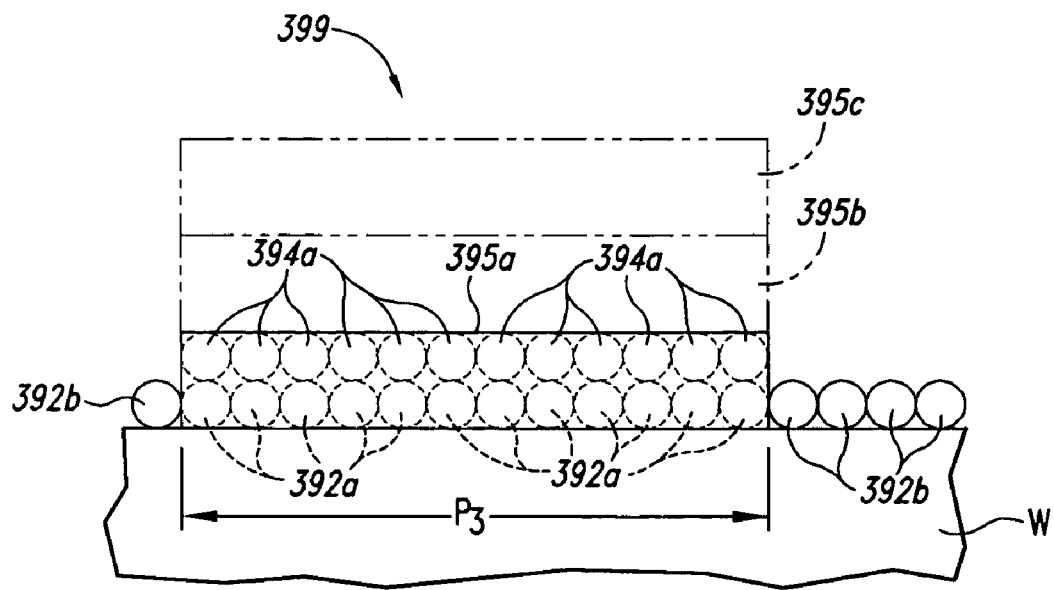

FIGS. 7A-7C illustrate stages in an ALD process in which the laser 170 activates molecules on the workpiece W in accordance with another embodiment of the invention. More specifically, FIG. 7A is a schematic side cross-sectional view of a portion of the workpiece W after dispensing a pulse of a first gas into the reaction chamber 120 (FIG. 4) and depositing a layer of first molecules 392 (shown as 392a and 392b) from the first gas onto the surface 190 of the workpiece W. After depositing the first molecules 392, the reaction chamber 120 can optionally be purged to remove excess molecules of the first gas. Next, the laser 170 moves across the workpiece W and directs the laser beam 172 toward selected first molecules 392a on a portion $P_3$ of the workpiece W. The power, wavelength, and other laser beam parameters are selected based on the chemistry of the first molecules 392 so that the energy from the laser beam 172 activates the selected first molecules 392a such that the molecules 392a are inclined to react with a subsequent gas. More specifically, the energy from the laser beam 172 breaks one or more of the bonds of the selected adsorbed molecules 392a, which destabilizes the molecules 392a such that the molecules 392a are inclined to react with the next molecule in the ALD sequence. As the laser 170 moves across the workpiece W, the laser beam 172 activates the selected first molecules 392a without exposing or activating a plurality of nonselected first molecules 392b on the workpiece W.

FIG. 7B is a schematic side cross-sectional view of the workpiece W after dispensing a pulse of a second gas into the reaction chamber 120 (FIG. 4) and depositing a layer of second molecules 394 (shown as 394a and 394b) from the second gas onto the workpiece W. The first and second gases can have the same or different compositions. The second molecules 394a proximate to the activated first molecules 392a react with the activated molecules 392a to form a discrete film 395 on the workpiece W. The second molecules 394b proximate to the nonactivated first molecules 392b generally do not react with the nonactivated molecules 392b.

FIG. 7C a schematic side cross-sectional view of the workpiece W after removing the nonreacted second molecules 394b (FIG. 7B) from the workpiece W. The nonreacted second molecules 394b can be removed from the workpiece W and the reaction chamber 120 (FIG. 4) by dispensing a purge gas into the chamber 120 and/or drawing the molecules 294b from the chamber 120 with the vacuum pump 140 (FIG. 4). In some embodiments, the nonactivated first molecules 392b can also be removed from the workpiece W; however, in other embodiments, the nonactivated first molecules 392b may not be removed from the workpiece W. In either case, the process can be repeated to build additional layers (shown in hidden lines as 395b and 395c) and form a feature 399 on the workpiece W.

In other embodiments, the laser 170 can irradiate the selected portion $P_3$ of the workpiece W after the second molecules 394 have been deposited onto the workpiece W. For example, in one method, a layer of first molecules 392 are deposited across the workpiece W, and then the reaction chamber 120 can be optionally purged. Next, a layer of second molecules 394 are deposited across the workpiece W, and then the laser 170 irradiates the selected portion $P_3$ of the workpiece W to activate the selected first and/or second molecules and catalyze the reaction between the selected molecules.

In additional embodiments, the methods described above with reference to FIGS. 7A-7C can also be used in a CVD process. For example, in one CVD process, a layer of first molecules can be deposited onto a workpiece, and the laser can activate a selected portion of the first molecules. Next, a plurality of second molecules can be deposited onto and react with the activated first molecules. Alternatively, as described above, the laser can irradiate the selected portion of the workpiece after a layer of second molecules have been deposited to catalyze the reaction between the selected first and second molecules.

D. Additional Embodiments of Deposition Systems

Figure 8:
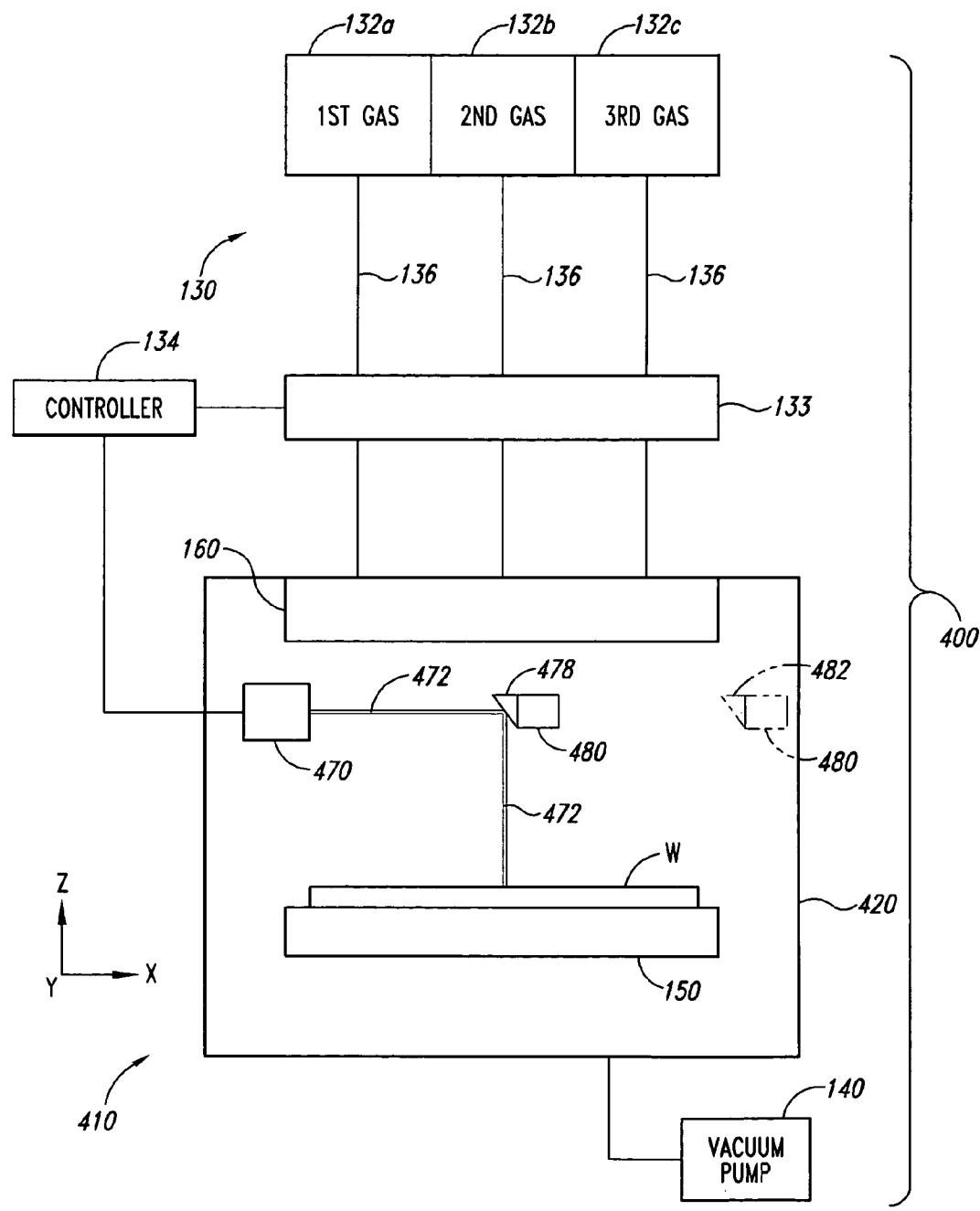
FIG. 8 is a schematic representation of a system for depositing materials onto a microfeature workpiece in accordance with another embodiment of the invention.

FIG. 8 is a schematic representation of a system 400 for depositing materials onto a microfeature workpiece W in accordance with another embodiment of the invention. The illustrated system 400 is generally similar to the system 100 described above with reference to FIG. 4. For example, the illustrated system 400 includes a reactor 410 having a reaction chamber 420 coupled to the gas supply 130 and the vacuum pump 140. The illustrated reaction chamber 420 includes a laser 470 (shown schematically) for producing a laser beam 472 along a path, a reflector 478 positioned along the path of the laser beam 472, and a positioning device 480 (shown schematically) for moving the reflector 478 relative to the workpiece W. The laser 470 can be fixed relative to the workpiece W and configured to pivot about the Z axis. The positioning device 480 can move the reflector 478 side to side (e.g., X direction) and forward and backward (e.g., Y direction) to reflect the laser beam 472 toward the selected portion of the workpiece W.

Figure 9:
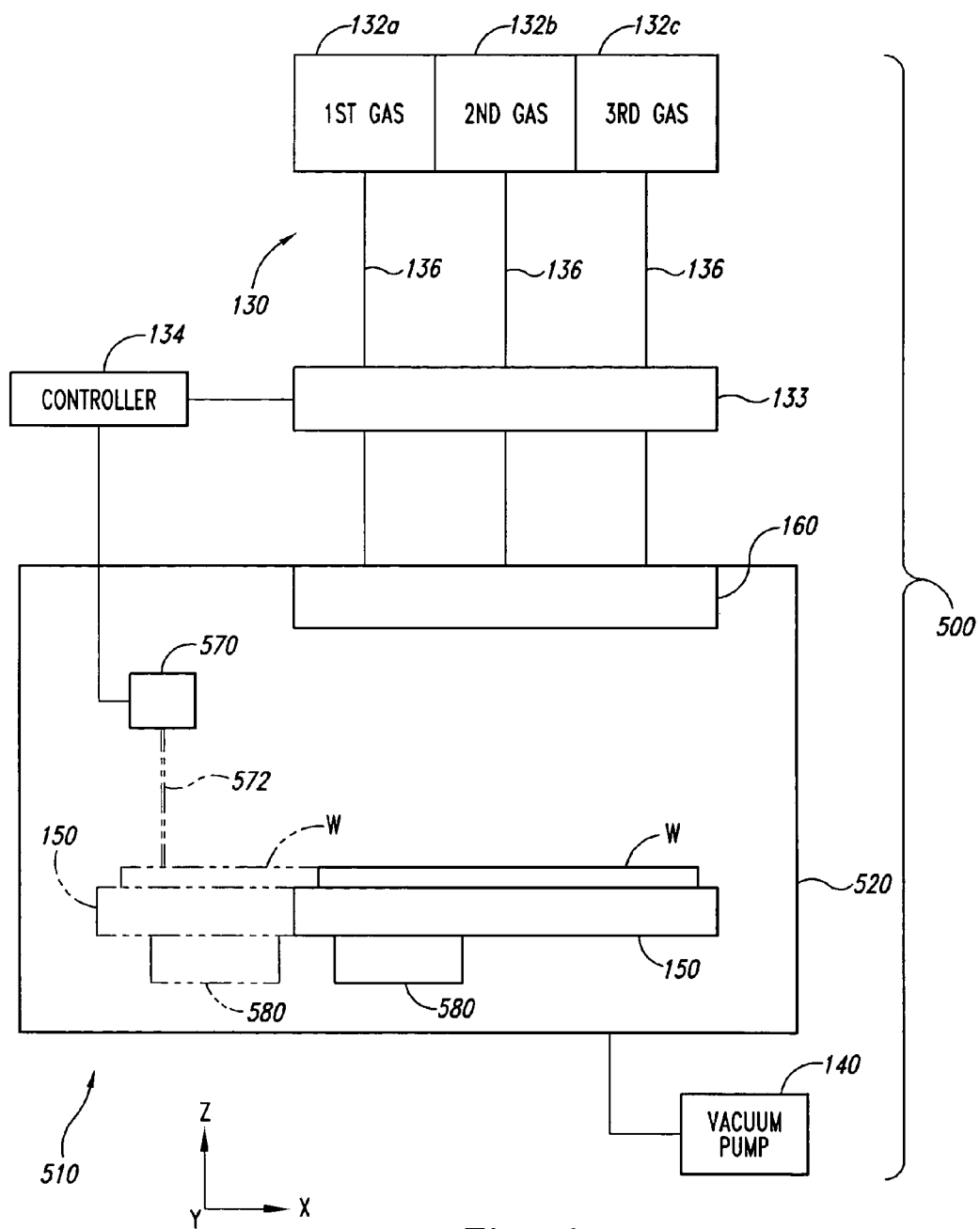
FIG. 9 is a schematic representation of a system for depositing materials onto a microfeature workpiece in accordance with another embodiment of the invention.

FIG. 9 is a schematic representation of a system 500 for depositing materials onto a microfeature workpiece W in accordance with another embodiment of the invention. The illustrated system 500 is generally similar to the system 100 described above with reference to FIG. 4. For example, the illustrated system 500 includes a reactor 510 having a reaction chamber 520 coupled to the gas supply 130 and the vacuum pump 140. The illustrated reaction chamber 520 includes a laser 570 (shown schematically) for generating a laser beam 572 (shown in hidden lines), a workpiece support 150 for carrying the workpiece W, and a positioning device 580 (shown schematically) attached to the workpiece support 150 for moving the workpiece W relative to the laser 570. For example, the positioning device 580 can move the workpiece support 150 from a first position (shown in solid lines) in which the workpiece W is oriented for deposition to a second position (shown in broken lines) in which the workpiece W is oriented for irradiation.

From the foregoing, it will be appreciated that specific embodiments of the invention have been described herein for purposes of illustration, but that various modifications may be made without deviating from the spirit and scope of the invention. For example, any one of the systems 100, 400 and 500 described above with reference to FIGS. 4, 8 and 9 can be used to perform any one of the methods described above with reference to FIGS. 5-7. Accordingly, the invention is not limited except as by the appended claims.

We claim:

1. A method of forming features on a workpiece by depositing material onto the workpiece in a reaction chamber, the method comprising:

depositing a monolayer or approximately a monolayer of molecules of a gas onto the workpiece in the reaction chamber, wherein the molecules of the gas comprise a plurality of first molecules of a first gas;

selectively irradiating a first portion of the first molecules on the workpiece in the reaction chamber with a laser beam having a selected radiation without irradiating a second portion of the first molecules on the workpiece with the selected radiation, wherein selectively irradiating the first portion comprises desorbing the first portion of the first molecules from the workpiece;

depositing second molecules of a second gas onto the second portion of the first molecules, the first and second gases having a different composition; and repeating the depositing and the selectively irradiating to form a feature on the workpiece.

2. The method of claim 1 wherein:

depositing the second molecules of the second gas comprises forming a layer of the second molecules on the second portion of the first molecules after desorbing the first portion of the first molecules.

3. The method of claim 1 wherein:

depositing the second molecules of the second gas comprises forming a layer of the second molecules on the first molecules before selectively irradiating the first portion of the first molecules; and selectively irradiating the first portion of the first molecules comprises desorbing the first portion of the first molecules and a first portion of the second molecules from the workpiece.

4. The method of claim 1 wherein the first gas comprises a first precursor and a second precursor different than the first precursor, and wherein the method further comprises:

flowing the first precursor into the reaction chamber;
flowing the second precursor into the reaction chamber; and
mixing the first and second precursors before depositing the first molecules of the first gas onto the workpiece.

5. The method of claim 1, further comprising exposing a first portion of the second molecules to the selected radiation without exposing a second portion of the second molecules.

6. The method of claim 1 wherein depositing the second molecules of the second gas occurs after selectively irradiating the first portion of the first molecules.

7. The method of claim 1 wherein:
depositing the second molecules of the second gas comprises depositing the second molecules of the second gas onto the first and second portions of the first molecules before selectively irradiating the first portion of the first molecules; and
the method further comprises selectively irradiating a first portion of the second molecules on the workpiece with the selected radiation without selectively irradiating a second portion of the second molecules on the workpiece.

8. The method of claim 1 wherein depositing a monolayer or approximately a monolayer of molecules of a gas onto the workpiece includes adsorbing the molecules to a surface of the workpiece.

9. The method of claim 8 wherein the second portion of the molecules remain adsorbed to the surface of the workpiece after selectively irradiating the first portion of the molecules.

10. A method of forming features on a workpiece by depositing material onto the workpiece in a reaction chamber, the method comprising:
depositing a monolayer of first molecules of a first gas onto the workpiece in the reaction chamber;
selectively altering a first portion of the first molecules on the workpiece in a pattern using a laser beam, wherein selectively altering the first portion of the first molecules comprises desorbing the first portion of the first molecules from the workpiece;
depositing second molecules of a second gas onto the second portion of the first molecules on the workpiece to form material with the first molecules, wherein the first and second gases have different compositions and
repeating the depositing and the selectively altering to form a feature on the workpiece.

11. The method of claim 10 wherein selectively altering the first portion of the first molecules comprises selectively irradiating the first portion of the first molecules.

12. A method of forming features on a workpiece by depositing material onto the workpiece in a reaction chamber, the method comprising:
depositing a monolayer or approximately a monolayer of first molecules of a first gas onto the workpiece in the reaction chamber;
directing a laser beam toward a first portion of the first molecules on the workpiece in the reaction chamber to desorb the first portion of the first molecules without desorbing a second portion of the first molecules;
depositing second molecules of a second gas onto the second portion of the first molecules, wherein the first and second gases have different compositions; and
repeating the depositing and the directing to form a feature on the workpiece.

13. The method of claim 12, further comprising directing the laser beam toward a first portion of the second molecules to desorb the first portion of the second molecules without directing the laser beam toward a second portion of the second molecules.

14. The method of claim 12 wherein the first gas comprises a first precursor and a second precursor different than the first precursor, and wherein the method further comprises:
flowing the first precursor into the reaction chamber;
flowing the second precursor into the reaction chamber; and
mixing the first and second precursors before depositing the first molecules of the first gas onto the workpiece.

15. The method of claim 12, further comprising removing the desorbed first portion of the first molecules from the reaction chamber before depositing the second molecules of the second gas.

16. The method of claim 12, further comprising removing the desorbed first portion of the first molecules from the reaction chamber while depositing the second molecules of the second gas.

17. The method of claim 12 wherein directing the laser beam occurs before depositing the second molecules of the second gas.

* * * * *

UNITED STATES PATENT AND TRADEMARK OFFICE
CERTIFICATE OF CORRECTION

| | | |
|---|---|---|
| PATENT NO. | : 8,133,554 B2 | |
| APPLICATION NO. | : 10/840571 | |
| DATED | : March 13, 2012 | |
| INVENTOR(S) | : Ross S. Dando et al. | |

It is certified that error appears in the above-identified patent and that said Letters Patent is hereby corrected as shown below:

In column 11, line 42, in Claim 10, delete "compositions" and insert -- compositions; --, therefor.

Signed and Sealed this
Fifteenth Day of May, 2012

David J. Kappos
*Director of the United States Patent and Trademark Office*